(12) United States Patent
Lee (10) Patent No.: US 10,667,384 B2
(45) Date of Patent: May 26, 2020

(54) LOW FREQUENCY REDUCED PASSIVE EQUALIZER

(71) Applicant: QUANTA COMPUTER INC., Taoyuan (TW)

(72) Inventor: Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/037,625

(22) Filed: Jul. 17, 2018

(65) Prior Publication Data

US 2020/0029422 A1  Jan. 23, 2020

(51) Int. Cl.
*H05K 1/02* (2006.01)
*H05K 1/18* (2006.01)

(52) U.S. Cl.
CPC ........... *H05K 1/025* (2013.01); *H05K 1/0243* (2013.01); *H05K 1/0245* (2013.01); *H05K 1/181* (2013.01); *H05K 2201/09236* (2013.01); *H05K 2201/1003* (2013.01); *H05K 2201/1006* (2013.01); *H05K 2201/10022* (2013.01)

(58) Field of Classification Search
CPC . H04B 3/04; H04B 3/14; H04B 3/144; H04B 3/147; H04B 7/005; H01P 9/003
USPC ....... 361/760–764, 782–784, 803; 333/28 R; 375/257, 285, 296, 316, 371
See application file for complete search history.

(56) References Cited

U.S. PATENT DOCUMENTS

| | | | | |
|---|---|---|---|---|
| 5,608,757 | A | * | 3/1997 | Smith ..................... H04L 25/45 333/166 |
| 9,225,563 | B1 | * | 12/2015 | Milirud ............. H04L 25/03878 |
| 9,432,230 | B1 | * | 8/2016 | Chang ...................... H04B 3/14 |
| 2004/0071219 | A1 | * | 4/2004 | Vorenkamp ............ H04B 3/144 375/257 |
| 2007/0030092 | A1 | | 2/2007 | Yeung et al. |
| 2012/0194304 | A1 | | 8/2012 | Muraoka |
| 2014/0266516 | A1 | | 9/2014 | Xiao et al. |
| 2014/0314136 | A1 | * | 10/2014 | Song ....................... H04L 27/01 375/230 |

(Continued)

FOREIGN PATENT DOCUMENTS

| | | |
|---|---|---|
| JP | 2012-010175 A | 1/2012 |
| JP | 2012-156921 A | 8/2012 |

(Continued)

OTHER PUBLICATIONS

JP Office Action for Application No. 2018-198196, dated Sep. 3, 2019, w/ First Office Action Summary.

(Continued)

*Primary Examiner* — Tuan T Dinh
(74) *Attorney, Agent, or Firm* — Nixon Peabody LLP; Zhou Lu (57) ABSTRACT

A differential trace structure reducing the magnitude of low frequency attenuation is disclosed. The trace structure is formed on a printed circuit board. A pair of differential traces connects a signal receiver and a signal transmitter. A passive equalizer has a first shunt coupled to one of the pair of differential traces; and a second shunt coupled to the other one of the pair of differential traces. The passive equalizer has an inductor and a resistor coupled in series to the shunts. For low frequency signals, the passive equalizer behaves as a shunt resistance to the pair of differential traces.

10 Claims, 5 Drawing Sheets

(56) References Cited

U.S. PATENT DOCUMENTS

| | | | |
|---|---|---|---|
| 2015/0071333 A1* | 3/2015 | Zhou | H04L 25/03343 375/219 |
| 2015/0171920 A1* | 6/2015 | Kameya | H04B 3/14 333/28 R |
| 2015/0288341 A1* | 10/2015 | Kameya | H04L 25/03 333/28 R |
| 2016/0380785 A1 | 12/2016 | Chung et al. | |
| 2017/0250730 A1* | 8/2017 | Chang | H04B 3/14 |

FOREIGN PATENT DOCUMENTS

| | | |
|---|---|---|
| JP | 2014-039162 A | 2/2014 |
| TW | 201345209 A | 11/2013 |

OTHER PUBLICATIONS

Extended European Search Report for EP Application No. 18202993.4, dated May 27, 2019.
TW Office Action for Application No. 107130905, dated Aug. 8, 2019, w/ First Office Action Summary.

* cited by examiner

FIG. 6B

LOW FREQUENCY REDUCED PASSIVE EQUALIZER

TECHNICAL FIELD

The present disclosure relates generally to allowing longer traces without degrading signal quality. More particularly, aspects of this disclosure relate to a low frequency reduced passive equalizer to reduce deviation between low frequency attenuation and high frequency attenuation on long differential signal traces.

BACKGROUND

High speed differential signal traces are widely used in a variety of products such as servers or storage products. Many servers and storage products include a chassis that supports and connects different printed circuit boards having various electronic devices mounted thereon. For example, a printed circuit board may have one or more integrated circuit chips mounted thereon, alone or in combination with analog devices or other devices. The printed circuit boards include various signal traces to provide signals to the devices on the boards. Signal traces generally are arranged in differential trace pairs for a particular signal.

Figure 1:
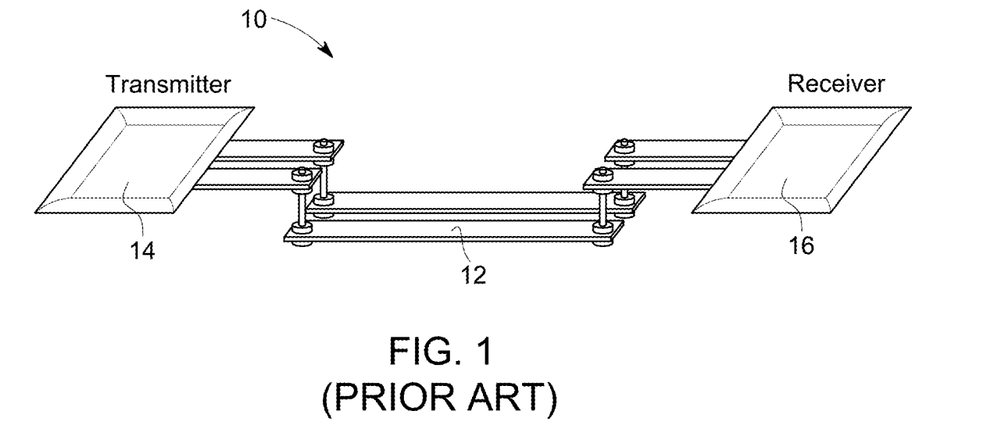
FIG. 1 is an example of a prior art printed circuit board with a differential trace channel connecting a receiver and a transmitter.

As printed circuit boards become more and more complex with the inclusion of more components, the routing for connections between components requires longer signal path lengths. FIG. 1 is an example of a circuit board 10 with a prior art signal trace 12 that serves as a signal channel connecting a transmitter 14 to a receiver 16. As the trace 12 gets longer due to spacing between the transmitter 14 and the receiver 16, it becomes more lossy, which degrades signal modulation of data. When signals are transmitted through a lossy channel, high and low frequency portions of the signal will have different attenuation. The longer the channel, the larger the deviation in attenuation between the high and low frequency portions of the signal. This deviation in attenuation can cause distortion when the receiver 16 samples and recovers bit information from input signals originating from the transmitter 14 and received through the signal trace 12.

Figure 2A:
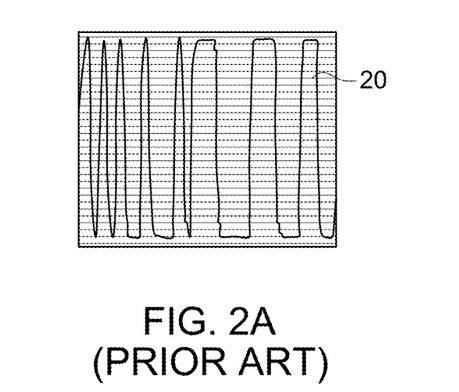
FIG. 2A is a plot of an input signal applied to the trace channel in FIG. 1.
Figure 2B:
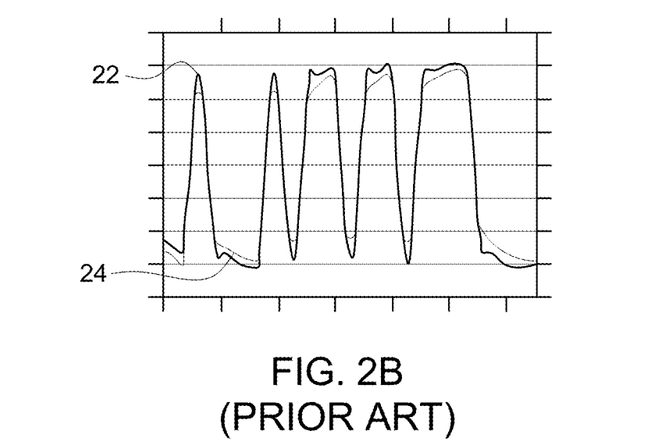
FIG. 2B is a plot of different output signals from the input signal in FIG. 2A depending on the length of the trace in FIG. 1.
Figure 2C:
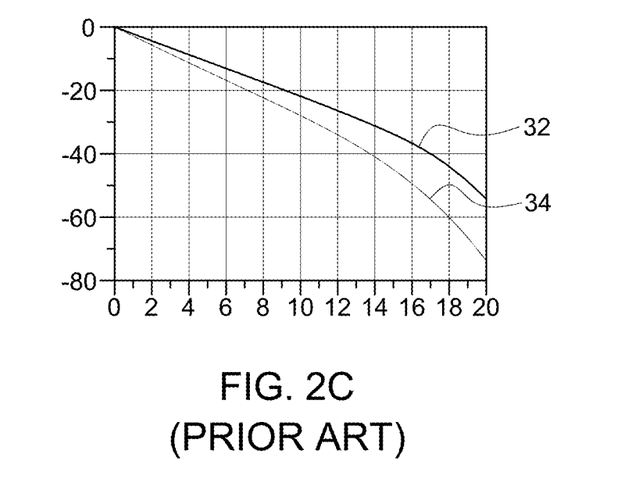
FIG. 2C is a plot showing signal attenuation depending on the length of the trace in FIG. 1.

This effect may be seen in the waveforms of a signal received from the signal trace 12. FIG. 2A is a plot of signal amplitude as a function of time, where line 20 shows a signal from the transmitter 14 being transmitted over the signal trace 12 in FIG. 1. FIG. 2B is also a plot of signal amplitude as a function of time, where lines 22 and 24 show signals received by the receiver 16 in FIG. 1 for different lengths of signal trace 12. In particular, line 22 shows the signal at the receiver 16 when the signal trace 12 has a length of 6000 mil. In contrast, a line 24 shows the signal at the receiver 16 when the signal trace has a length of 12000 mil. FIG. 2C is a plot of attenuation as a function of frequency for different lengths of signal trace 12. In particular, line 32 shows the attenuation for the shorter channel length (6000 mil), and line 34 shows the attenuation for the longer channel length (12000 mil). As may be seen in FIG. 2C, the attenuation increases as a function of frequency for both lengths. However, the amount of attenuation increases as the length of the trace increases. This is shown by the greater attenuation in line 34 versus line 32. Consequently, this indicates that the distortion in the signal trace increases as the length of the signal trace increases.

For such longer path applications, active components like a re-driver are introduced and used in recent designs in order to allow sufficient signal transmission. For example, in a typical server, 20" data paths are used. The recent Peripheral Component Interconnect Express (PCIe) 4 standard requires a re-driver to insure signal integrity over the length of the data path in the server. A re-driver is a signal amplifier that receives a signal at a point of the channel and amplifies the signal to reduce attenuation. Re-drivers therefore are currently required to deploy PCIe 4 type components in servers. However, a re-driver component increases system power requirements and design complexity. It is therefore desirable to simplify design complexity and reduce system power by minimizing the number of re-drivers. However, this inhibits flexibility of design, since longer traces cannot be used. Thus connected components must be placed in relative proximity to each other.

There is therefore a need for a passive component to reduce deviation between high and low frequency attenuation to allow longer signal path applications. There is a further need for a component that allows maintaining the same system power over the length of a return path in a differential signal trace pair. There is a further need for a passive component that does not require additional energy for operation.

SUMMARY

One disclosed example is a high speed circuit. The high speed circuit includes a printed circuit board. The high speed circuit includes a signal transmitter and a signal receiver on the printed circuit board. A pair of differential traces connects the signal receiver and the signal transmitter. A passive equalizer is coupled to the pair of differential traces. The passive equalizer behaves as a shunt resistance to the pair of differential traces for low frequency signals.

Another example is passive equalizer to reduce the attenuation of signals on a differential trace pair. A first shunt is coupled to one of the pair of differential traces. A second shunt is coupled to the other one of the pair of differential traces. An inductor has one end coupled to the first shunt. A resistor has one end coupled to the opposite end of the inductor, and an opposite end coupled to the second shunt. The inductor and resistor behave as a shunt resistance to the pair of differential traces for low frequency signals.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 3:
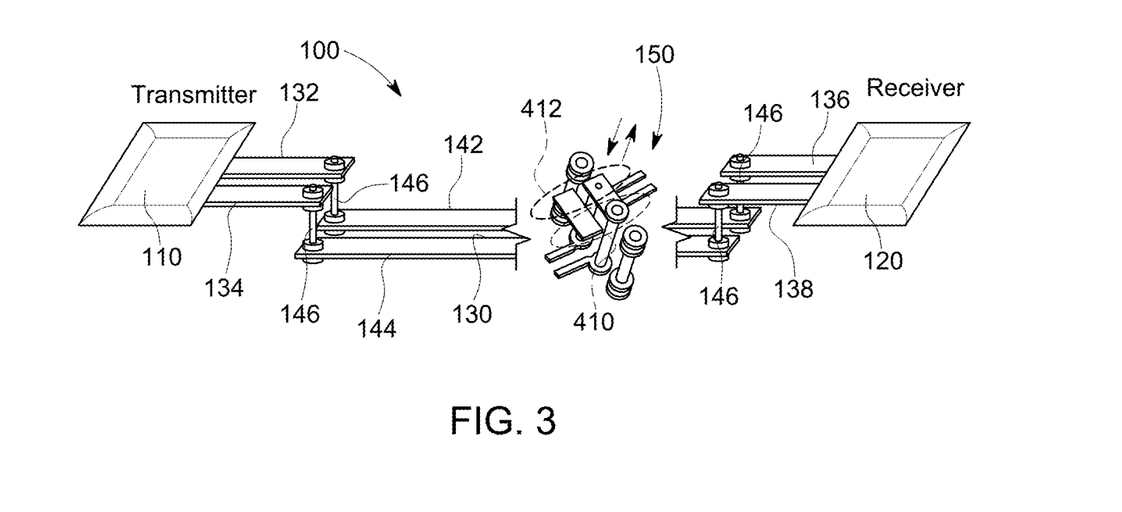
FIG. 3 is a circuit board with a differential signal pair trace with a passive equalizer to reduce attenuation.

FIG. 3 shows a schematic illustration of a circuit board 100 configured in accordance with the present disclosure. As shown in FIG. 3, the circuit board 100 includes a signal transmitter component 110 and a signal receiver component 120. A pair of differential signal traces 130 form a channel that allows signals to be sent between the transmitter component 110 and the receiver component 120. The traces 130 include a pair of input segments 132 and 134 that are connected to the signal transmitter component 110. The traces 130 also include a pair of output segments 136 and 138 that are coupled to the signal receiver component 120.

In this example, the main length of the traces 130 are carried through main body components 142 and 144. In this example, the traces 130 have a length that makes potential signal attenuation a consideration. In this example, the main body components 142 and 144 are formed on an opposite surface of the printed circuit board 100 from the surface that the signal transmitter component 110 and the receiver component 120 are mounted. This allows the surface of the printed circuit board 100 to be available for additional components. A series of vias 146 are formed through the circuit board 100 to connect the main body components 142 and 144 with the input segments 132 and 134 and the output segments 136 and 138. Although the traces 130 in this example are roughly rectangular in shape, the traces may be of any shape. Further, the traces may be formed on the same side of the printed circuit board 100 as the transmitter 110 and receiver 120.

As explained below, a passive equalizer component 150 is interposed between the main body components 142 and 144. The passive equalizer component 150 addresses signal attenuation with different channel length of the main body segments 142 and 144. The passive equalizer component 150 equalizes the energy of high and low frequency portions of a signal transmitting through a lossy channel such as the traces 130. In this example, the passive equalizer component 150 is fabricated on the top surface of the circuit board 100, but the passive equalizer component 150 could be fabricated on the bottom surface of the circuit board 100.

In fact, most equalizers behave as high pass filter. For a passive high pass filter, although low frequency portions will encounter larger attenuation to equalize the energy, the high frequency portions will be attenuated as well. The passive equalizer component 150 may be located anywhere along the length of the main body segments 142 and 144.

For active high pass filters, additional power is required to achieve gain of high frequency portions of a signal. To equalize high and low frequency portions, the passive equalizer component 150 is linked by shunts connected with the differential pair of traces. This arrangement will allow the high frequency portions of signals to propagate without attenuation and only reduces low frequency energy. Thus, the low frequency portions of signals are equalized with the high frequency portions, resulting in low frequency passive equalization.

Figure 4:
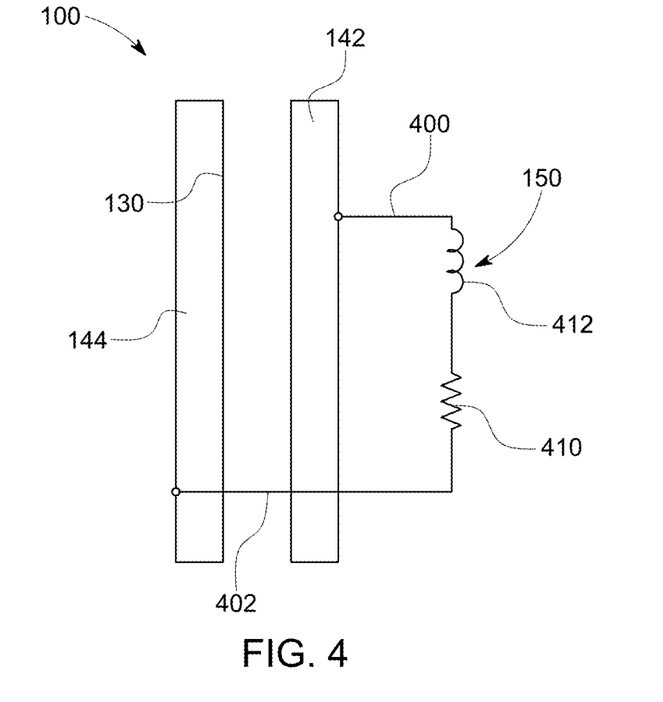
FIG. 4 is a circuit diagram of the differential signal pair trace in FIG. 3, with a passive equalizer in accordance with the present disclosure.

FIG. 4 is a circuit diagram showing one exemplary configuration for the passive equalizer component 150 interposed between traces 130. As explained above, the passive equalizer component 150 behaves as a low frequency passive equalizer. In the exemplary configuration of FIG. 4, the passive equalizer component 150 includes a series arrangement of a resistor 410 and an inductor 412. A first end of this series arrangement of the passive equalizer component 150 is then coupled to the main component 142 of the traces 130 via a first shunt 400. A second end of the series arrangement of the passive equalizer component 150 is coupled to the main component 144 of the traces 130 using as second shunt 402.

Although a single inductor and resistor is shown in this example, additional inductors or resistors may be connected in parallel to the inductor 412 and resistor 410. Further, other circuits that function as a low frequency passive equalizer may be used. For example, another resistor may be interposed between the inductor 412 and the shunt 402 or a capacitor and resistor circuit may be used.

In operation, the inductor 412 behaves as a short circuit in the low frequency range and becomes an open circuit in the high frequency range. In the low frequency range, the series arrangement of the resistor 410 and the inductor 412 of the passive equalizer component 150 is therefore equivalent to a shunt resistance load on the traces 130. This results in a smaller amplitude signal given that the current is identical. In the high frequency range, since the inductor 412 behaves as an open circuit, there will be no amplitude attenuation. For example, in signals from 0-4 GHz, an inductor of 30 nH and a resistor of 100 Ohms may be used. For signals from 5-8 GHz, an inductor of 4 nH and a resistor of 150 Ohms may be used.

Figure 5:
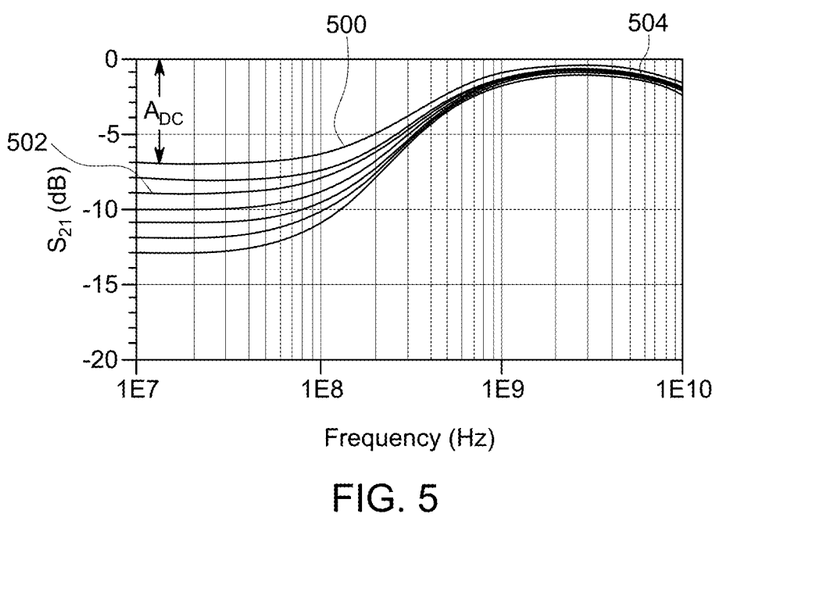
FIG. 5 is a log-linear plot of the gain of a signal as a function of frequency.

FIG. 5 is a log-linear plot of the gain of a signal as a function of frequency as defined in the PCIe 3.0 base specification. FIG. 5 shows traces 500 representing different gains due to the length of the channel. As seen in FIG. 5, when the signal is at lower frequencies 502, attenuation occurs. Such attenuation is more pronounced for transmission over a longer channel. However, as frequency increases to a higher frequency 504, all of the signal gains converge. Thus, the passive equalizer component 150 is effective in equalizing low frequency signals by providing a shunt resistance while behaving as an open circuit for high frequency signals.

An example of the application of high speed differential traces may be on a circuit board for a server. In one example, servers have a 20" data path and therefore, in previously known designs, the PCIe 4 protocol requires an active re-driver to insure signal integrity over the length of the data path. However, application of a passive equalizer component, such as the passive equalizer component 150 in FIG. 3, will allow PCIe type devices to be connected together without the use of re-drivers or other active components—even when data paths are on the order of a 20" length.

Figure 6A:
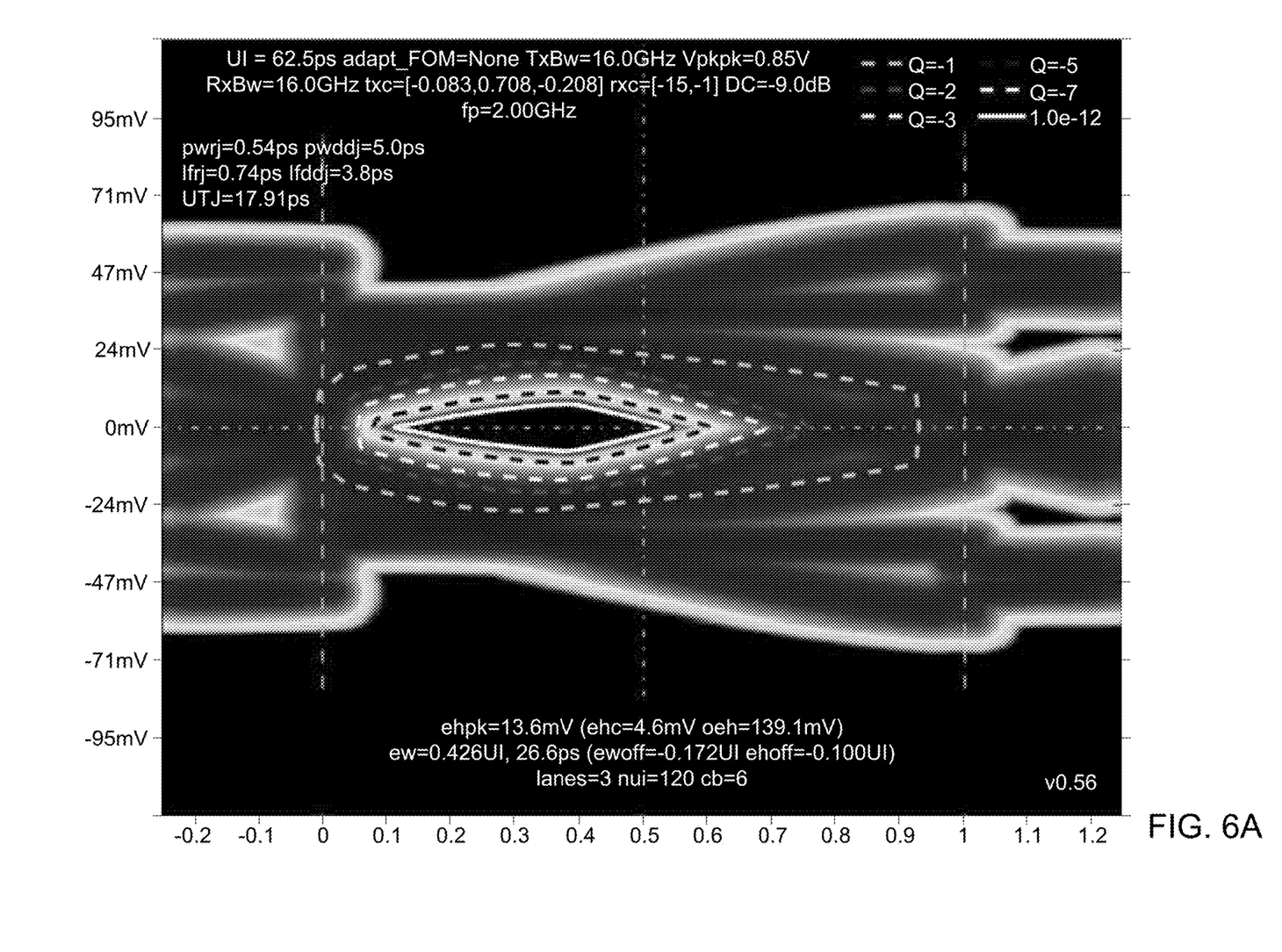
FIG. 6A is a simulation result of a signal transmitted through a differential signal pair trace.
Figure 6B:
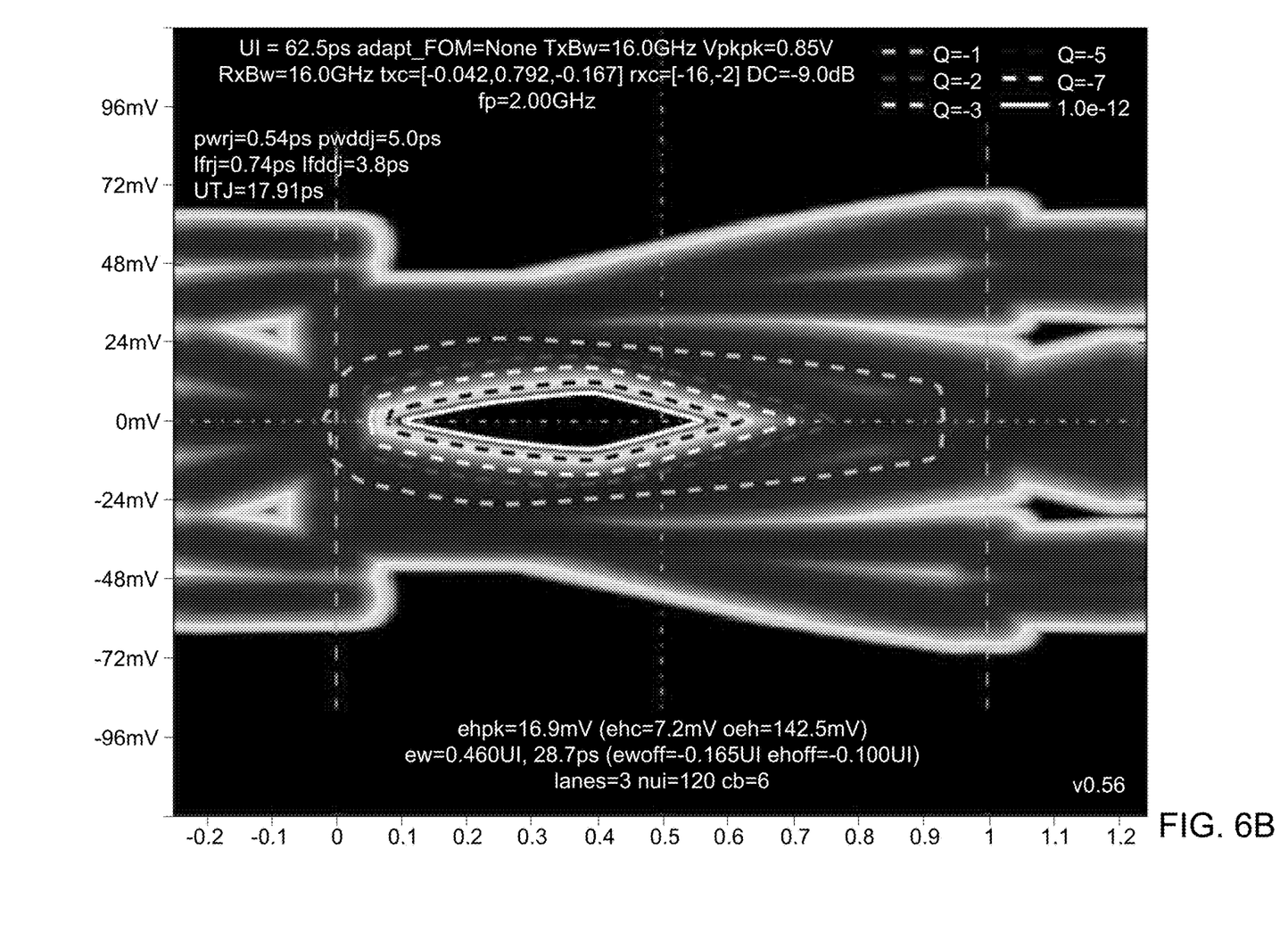
FIG. 6B is a simulation result of a signal transmitted through a differential signal pair trace with a passive equalizer.

FIG. 6A and FIG. 6B are simulation results from signals from a 20" PCIe 4 channel. FIG. 6A is the simulation result from a differential signal trace pair without the application of the low frequency reduced passive equalizer component 150 in FIG. 3. FIG. 6B is the simulation result from a differential signal trace pair with the application of a low frequency reduced passive equalizer 150, as shown in FIG. 3. From the simulation results in FIGS. 6A and 6B, a low frequency reduced passive equalizer may enlarge both height (ehpk) and width (ew) of receiver eye-diagrams. As shown in FIGS. 6A-6B, the height (ehpk) is increased from 13.6 mV to 16.9 mV, while the width (ew) is increased from 0.426 UI to 0.460 UI.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A high speed circuit, comprising:
   a printed circuit board having a top surface and a bottom surface;
   a signal transmitter on the printed circuit board;
   a signal receiver on the printed circuit board;
   a pair of differential traces connecting the signal receiver and the signal transmitter; and
   a passive equalizer connected to the pair of differential traces, the passive equalizer interconnecting the signal transmitter and the signal receiver, the passive equalizer being neither a part of the signal transmitter, nor a part of the signal receiver, the passive equalizer behaving as a shunt resistance between the pair of differential traces for low frequency signals, wherein the passive equalizer comprises an inductor coupled between the pair of differential traces and positioned on the top surface or the bottom surface.

2. The high speed circuit of claim 1, wherein the passive equalizer includes a first shunt coupled to one of the pair of differential traces, a second shunt coupled to the other one of the pair of differential traces, and the inductor and a resistor coupled in series to the shunts.

3. The high speed circuit of claim 1, wherein the differential traces are fabricated on an opposite surface of the printed circuit board from a surface mounting the receiver and transmitter components.

4. The high speed circuit of claim 1, wherein the passive equalizer, the signal receiver, and the signal transmitter are mounted on the top surface of the printed circuit board.

5. The high speed circuit of claim 1, wherein the differential traces carry signals according to the peripheral component interface express standard.

6. The high speed circuit of claim 1, wherein the inductor is selected from a 30 nH inductor and a 4 nH inductor, wherein the 30 nH inductor is selected when the signal transmitter is configured to transmit signals from 0-4 GHz, and wherein the 4 nH inductor is selected when the signal transmitter is configured to transmit signals from 5-8 GHz.

7. The high speed circuit of claim 2, wherein the inductor is selected to operate as a short circuit equivalent for high frequency signals and as a filter for low frequency signals.

8. The high speed circuit of claim 3, wherein a main length of the differential traces are carried through a pair of main body components, respectively.

9. A passive equalizer to reduce the attenuation of low frequency signals on a differential trace pair comprising a first trace and a second trace on a printed circuit board having a top surface and a bottom surface, the passive equalizer consisting of:
- a first shunt having a first end and a second end, the first end of the first shunt coupled to the first trace of the pair of differential traces on the printed circuit board;
- a second shunt having a first end and a second end, the first end of the second shunt coupled to the second trace of the pair of differential traces on the printed circuit board;
- one or more inductors coupled between the second end of the first shunt and the second end of the second shunt, the one or more inductors positioned on the top surface or the bottom surface of the printed circuit board; and
- one or more resistors coupled in series with the one or more inductors between the second end of the first shunt and the second end of the second shunt, wherein the one or more inductors and the one or more resistors behave as a shunt resistance to the pair of differential traces for low frequency signals.

10. The passive equalizer of claim 9, wherein the inductor is selected from a 30 nH inductor and a 4 nH inductor, wherein the 30 nH inductor is selected when the passive equalizer is configured for signals from 0-4 GHz, and wherein the 4 nH inductor is selected when the passive equalizer is configured for signals from 5-8 GHz.

\* \* \* \* \*